United States Patent
Bohnert et al.

(10) Patent No.: US 9,983,236 B2
(45) Date of Patent: May 29, 2018

(54) OPTICAL SENSOR

(71) Applicant: ABB Technology AG, Zurich (CH)

(72) Inventors: Klaus Bohnert, Oberrohrdorf (CH); Andreas Frank, Zurich (CH); Georg Müller, Glattpark (CH); Lin Yang, Widen (CH)

(73) Assignee: ABB Schweiz AG, Baden (CH)

( * ) Notice: Subject to any disclaimer, the term of this patent is extended or adjusted under 35 U.S.C. 154(b) by 0 days. days.

(21) Appl. No.: 15/187,442

(22) Filed: Jun. 20, 2016

(65) Prior Publication Data
US 2016/0305984 A1  Oct. 20, 2016

Related U.S. Application Data

(63) Continuation of application No. PCT/EP2013/077709, filed on Dec. 20, 2013.

(51) Int. Cl.
*G01D 5/353* (2006.01)
*G01R 15/24* (2006.01)

(52) U.S. Cl.
CPC ......... *G01R 15/245* (2013.01); *G01R 15/247* (2013.01)

(58) Field of Classification Search
CPC ....... G01J 9/02; G01D 5/353; G01D 5/35303; G01D 5/35319
See application file for complete search history.

(56) References Cited

U.S. PATENT DOCUMENTS

| | | | |
|---|---|---|---|
| 5,029,969 A * | 7/1991 | Seike | G02B 6/442 174/139 |
| 5,895,912 A * | 4/1999 | Bosselmann | G01R 15/247 250/227.17 |
| 2005/0135743 A1 * | 6/2005 | Ascanio | G02B 6/12026 385/37 |
| 2009/0039866 A1 * | 2/2009 | Bohnert | G01R 15/246 324/97 |
| 2012/0283969 A1 * | 11/2012 | Bohnert | G01R 15/246 702/64 |

FOREIGN PATENT DOCUMENTS

WO    2007121592 A1    11/2007

OTHER PUBLICATIONS

International Search Report and Written Opinion, PCT/EP2013/077709, ABB Technology AG, dated Oct. 23, 2014, 9 pages.

* cited by examiner

*Primary Examiner* — Jonathan Hansen
(74) *Attorney, Agent, or Firm* — Taft Stettinius & Hollister LLP; J. Bruce Schelkopf

(57) ABSTRACT

A method of increasing accuracy of optical sensors based on generating two sets of light waves having different velocities in the presence of a non-vanishing measurand field within a sensing element of the sensor is described. A defined static bias phase shift is introduced between the two sets of light waves. The sensor converts a total optical phase shift including static bias optical phase shifts and measurand-induced optical phase shifts into anti-phase optical power changes in at least two detector channels. The method includes steps of normalizing the optical power changes after their conversion into electrical detector signals in the two detector channels to reduce effects of uneven intensity or power of the light source and different loss or gain in the detector channels. Further methods, sensors and apparatus for temperature stabilizing such optical sensors and novel sensors are also presented.

17 Claims, 8 Drawing Sheets

FIG. 6A
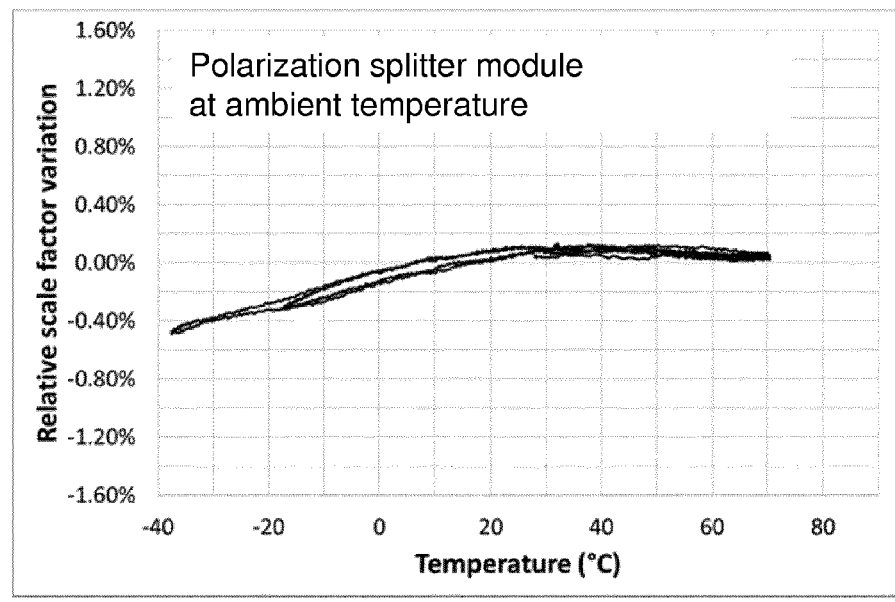
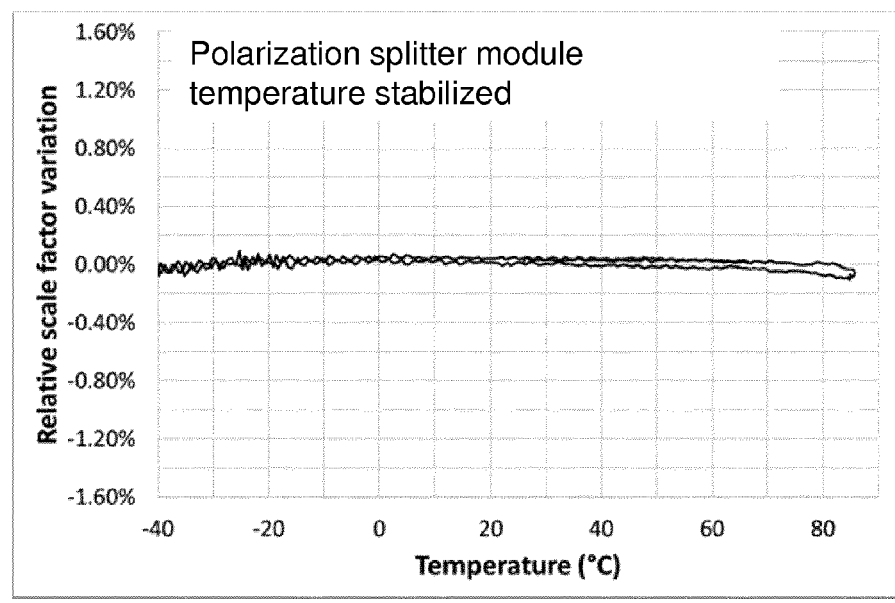
FIG. 6B

OPTICAL SENSOR

FIELD OF THE INVENTION

The disclosure relates to an optical sensor with a sensing element causing a phase shift of light waves passing through it in the presence of a measurand field, such as a fiber optic current sensor (FOCS) or magnetic field sensor that includes a sensing fiber to be exposed to a magnetic field, e.g. of a current to be measured, as typically used in high voltage or high current applications.

BACKGROUND OF THE INVENTION

Fiber-optic current sensors rely on the magneto-optic Faraday effect in an optical fiber that is coiled around the current conductor. The current-induced magnetic field generates circular birefringence in the optical fiber that is proportional to the applied magnetic field. A preferred arrangement employs a reflector at the sensing fiber's far end so that the light coupled into the fiber performs a round trip in the fiber coil. Commonly, left and right circularly polarized light waves are injected into the sensing fiber which are generated from two orthogonal linearly polarized light waves by a fiber optic phase retarder spliced to the sensing fiber and acting as quarter-wave retarder (QWR), as described in reference [1]. After the round trip through the fiber coil the two circular waves have accumulated a relative phase delay proportional to the applied current as a result of the circular birefringence in the fiber. This phase delay is proportional to the number of fiber windings around the current conductor, the applied electrical current, and the Verdet constant $V(T, \lambda)$ of the fiber: The Verdet constant is material-, temperature-, and wavelength-dependent.

As an alternative the sensor may be designed as a Sagnac-type interferometer with quarter-wave retarders (QWRs) at both sensing fiber ends and light waves of the same sense of circular polarization that are counter-propagating in the sensing fiber (see ref. [1]).

Further known are voltage or electric field sensors based on the Pockels effect (linear electro-optic effect) [21] or on the use of an optical fiber coupled to a piezo-electric material [16, 7]. In these sensors, birefringence induced by the electric field or force or anisotropic change in the refractive index of the material is used in the optic sensor to measure voltages or electric field strength.

High performance current sensors often use an interferometric technique based on non-reciprocal phase modulation as also applied in fiber gyroscopes in order to measure the optical phase shift, see e.g. ref. [2]. Integrated-optic phase modulators or piezo-electric modulators are employed. The technique provides, particularly in combination with closed-loop detection, high accuracy, good scale factor stability, and a linear response over a large range of magneto-optic phase shift. On the other hand the technique is relatively sophisticated and often requires polarization-maintaining (PM) fiber components and elaborate signal processing. Moreover, integrated-optic modulators are relatively expensive components.

By contrast simpler detection schemes employ passive optical components such as wave-plates and polarizers which convert the magneto-optic phase shift into a change of the transmitted optical power (as described for example in reference [3]). In order to make the sensor output independent of, e.g., variations of the light source power, such sensors often work with at least two detection channels. The optical power in the two channels varies with opposite phase (anti-phase) in response to the current to be measured. In principle, the difference of the two signals divided by their sum is proportional to the current and is independent of the source power. However, asymmetries in the two channels, such as different optical losses, influences of stress, and their variation over time and temperature, limit the achievable accuracy of this type of sensors. While the sensor accuracy may be sufficient for protection functions in high voltage substations (IEC accuracy class 5P demands an accuracy to within ±1% at the rated current), the accuracy typically is insufficient for electricity metering; the IEC metering class 0.2 for example demands an accuracy to within 0.2% at the rated current (reference [4]).

U.S. Pat. No. 5,895,912 discloses a polarimetric AC sensor in which DC signal components are used to intensity-normalize the AC measurement signals.

It is therefore an object of the invention to provide optical sensors of the above kind, such as magnetic field sensors or fiber-optic current sensors (FOCSs), and related methods that increase the accuracy of such sensors even when using passive optical components instead of actively phase modulating components to detect a relative phase shift between light waves.

SUMMARY OF THE INVENTION

According to a first aspect of the invention there is provided a method of increasing the accuracy of an optical sensor based on generating two sets of light waves having different velocities in the presence of a non-vanishing measurand field within a sensing element of the sensor and with a defined static bias phase shift introduced between the two sets of light waves, with the sensor converting a total optical phase shift including the static bias optical phase shift and the optical phase shift induced by said measurand field into optical power changes of opposite signs (anti-phase) in at least two detector channels, with the method including the step of normalizing the optical power changes after their conversion into electrical detector signals in two detector channels to reduce the effects of uneven intensity and different loss or gain in the detector channels.

The two sets of light waves are typically orthogonal linearly polarized light waves or left and right circularly polarized light waves. Preferably, the phase shift between both sets is converted into changes of optical power having opposite signs (i.e. being in anti-phase) in the two detector channels.

Due to the introduction of a static bias optical phase shift between the two sets of light waves, the detection applied is a passive detection and thus does not require an active optical phase modulation. The static bias optical phase shift is typically around $(2n+1) \times 90°$, particularly within $(2n+1) \times 90° \pm 20°$ or $(2n+1) \times 90° \pm 5°$, wherein n is any integer number. The static bias optical phase shift can be introduced, e.g., by using at least one quarter-wave retarder or a Faraday rotator.

For current or magnetic field measurement the sensing element can be an optical fiber element, a bulk magneto-optic material (such as a Yttrium iron garnet crystal or fused silica glass), or an optical fiber or bulk optic material attached to a magnetostrictive element. For voltage or electric field measurement the sensing element can be an electro-optic crystal [21], a crystalline electro-optic fiber [19], a poled fiber [20], or a fiber attached to a piezo-electric material [7].

The normalization of the optical power changes is derived from filtering spectral components from the electrical detector signals of the detection channels and combining the spectral components or at least one normalization factor derived therefrom with at least one detector signal to yield normalized detector signals.

The spectral components can be filtered AC components and/or transient components of at least one of the detector signals and/or (low-pass) filtered components or DC components of at least one of the detector signals. The method in accordance with the present invention can be used for measuring DC, AC, or transient measurand fields. The spectral components may be time-averaged for noise reduction.

The AC spectral components are preferably in a range around a nominal frequency of the measurand field, such as in the range of 45 Hz to 65 Hz for the standard electric power grid frequencies. If amplitudes of AC and transient spectral components fall below a threshold, they can be replaced by either default values or by low-pass filtered signal components.

In case AC or transient fields are measured, the combined sensor signal after normalization is preferable high-pass filtered.

According to a second aspect of the invention, which may or may not be combined with the first aspect as described above or with the third aspect as described below, for an AC or transient field measurement a temperature of the (passive) optical elements introducing the static bias optical phase shift is derived from the low frequency or DC components of the sensor signal. The DC or low frequency components depend on the static bias optical phase shift. The bias phase shift can change as the temperature of the optical components introducing the phase shift changes and thus can be indicative of the component's temperature. In other words, the DC or low frequency component of the signal can serve as a measure of the temperature at the location where the static bias optical phase shift is introduced, such as a suitable integrated-optic polarization splitter module, which can be used for this purpose.

With the knowledge of such a temperature an AC or transient sensor signal can be corrected accordingly. This temperature compensation can be applied in combination with other temperature compensations, particularly with a temperature compensation of the sensing element, itself.

The above aspects and the steps required can be implemented as part of and executed by a signal processing unit of the sensor.

According to a third aspect of the invention, which may or may not be combined with the aspects as described above, the sensor includes at least: a light source and at least one light detector, preferably at least two light detectors; and at least two, preferably at least three, optical transmission channels, with one channel providing a forward channel for the light to a sensing element and one or two channels providing return detector channels for the light to the detectors; and one or more passive optical elements for introducing a static bias optical phase shift between two different sets of light waves, that have different velocities within said sensing element in the presence of a non-vanishing measurand field, and for converting a total optical phase shift including the static bias optical phase shift and an optical phase shift induced by the measurand field into optical power changes of opposite signs (anti-phase) in at least two detector channels; and a polarization maintaining (PM) fiber with the PM fiber being connected directly or indirectly via at least one retarder or a Faraday rotator element to the sensing element; with at least parts of the one or more passive optical elements being in thermal contact with a temperature stabilizing unit providing a controlled temperature environment for the one or more passive optical elements. Such a unit can include for example at least one self-regulated heating resistor, in particular at least one self-regulated heating resistor foil.

In a preferred embodiment of this aspect of the invention, at least parts of the one or more passive optical elements are at ground potential and the PM fiber provides an optical connection from ground potential to the potential of the sensing element, with the latter potential being different from ground potential and typically being a medium voltage or high voltage. In such a case it is advantageous to guide the PM fiber through an insulator column, in particular a hollow core insulator column best filled with insulating material.

The one or more passive optical elements for introducing a static bias optical phase shift and the one or more passive optical elements converting a total optical phase shift are best combined in an integrated optical polarization splitter module with at least two or three ports on the optical source/detector side and one port on the sensing element side, with the port on the sensing element side being connected to the PM fiber.

As with other aspects of the invention, the sensor can be adapted to measure AC or DC fields, in particular magnetic fields, current, electric fields, voltage, or force fields.

The above and other aspects of the present invention together with further advantageous embodiments and applications of the invention are described in further details in the following description and figures.

BRIEF DESCRIPTION OF THE FIGURES

FIGS. 6A, 6B illustrate an improvement of sensor signal stability with temperature achieved by an example in accordance with an aspect of the invention;

DETAILED DESCRIPTION

Figure 1:
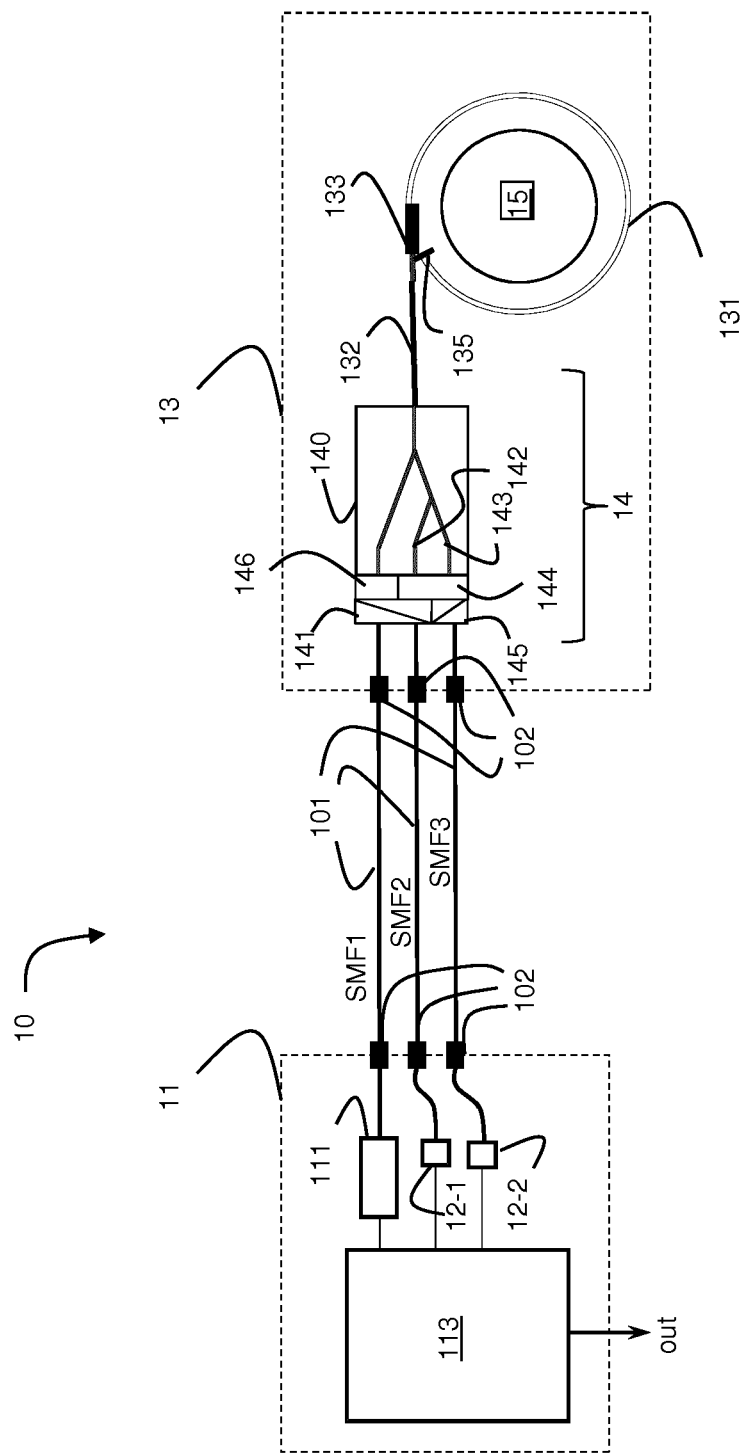
FIG. 1 is schematic diagram of components of a fiber optic current sensor with passive elements for introducing a static bias optical phase shift between two different sets of light waves and for converting a total optical phase shift including the static bias optical phase shift and an optical phase shift induced by a measurand field into optical power changes of opposite signs.

In FIG. 1 there is shown the example of a configuration of an optical current sensor using a static bias optical phase shift as signal detection scheme. For further details and possible modifications of the known elements of FIG. 1 reference can be made to [3].

As described further below such sensors with passive elements to introduce a bias phase shift can benefit from the various accuracy-increasing aspects of the present invention to be described below, such as signal processing comprising normalization and filtering of raw signals and additional temperature compensation means.

In the example of FIG. 1, the sensor 10 includes an opto-electronics module 11 which houses for example a broad-band light source 111, e.g. a superluminescent diode, two photo detectors 12-1, 12-2, and a signal processing unit 113 with power supply and other electronic components (not shown). It is worth noting that any connection between the opto-electronics module 11 and a sensor head 13 with the sensing element 131 is purely optical and is made in the example shown by single mode fibers 101 and single mode fiber connectors 102. In addition, the elements in the optical path outside the opto-electronics module 11 are passive optical components and hence do not require electrical activation.

The light from the light source 111 is depolarized, for example in a fiber Lyot depolarizer (not shown). The (optical) connection between the opto-electronic module 11 and the sensor head 13 is made through three single-mode optical fibers 101 (SMF1, SMF2, SMF3), which connect to three source side ports of an integrated optical polarization splitter module 14, which in the example shown is based on an integrated-optic 1×3 splitter/combiner 140 (SC) forming the module together with the polarizers and retarders (141, 144, 145) attached to it. A first of such polarizers is polarizer 141 (P1), which polarizes the light at entrance to the SC 140 at a first port, also referred to as the SC light source channel, on the source side face. Preferably, the polarization direction is at 45° with the respect to the normal of the SC plane. The waveguides within the SC 140 are of low birefringence in order not to alter the polarization state of the transmitted light.

At the opposite SC face (also referred to as coil-sided face) the light is coupled into a polarization-maintaining (PM) fiber pigtail 132. The principal axes of the PM fiber 132 are parallel and perpendicular to the SC plane, i.e. at 45° to the polarization direction of the polarizer P1 141. As a result both orthogonal polarization-modes of the PM fiber 132 are excited with the same amplitude.

A fiber-optic quarter-wave retarder 133 converts the orthogonal linearly polarized light waves into left and right circularly polarized waves before the light enters the sensing fiber 131. The sensing fiber forms a coil with an integer number of fiber loops around a current conductor 15. The light is reflected at the far end of the fiber 131 by a reflector 135 and then passes the coil a second time. Upon reflection the polarization states of the two light waves are swapped, i.e. left circular light becomes right circular and vice versa.

The retarder 133 converts the reflected circular waves back to orthogonal linear waves. The polarization directions of the returning linear waves are also swapped compared to the forward propagating waves. The returning orthogonal waves have a magneto-optic phase shift $\Delta\phi$ as a result of the Faraday effect (see also eq. [3] below). The SC 140 splits the orthogonal light waves into two optical detection channels 142, 143. A quarter-wave retarder plate (QWR) 144 at the source side face is used as the element to introduce a static bias optical phase shift, which in this example is a 90° differential phase delay between the orthogonal waves of both detection channels 142, 143. The principal axes of the QWR 144 are aligned parallel to the axes of the PM fiber pigtail 132 and at 45° to polarizer P1 141.

The orthogonal waves of a first of the detector channels 142, 143 interfere at the polarizer P1 141 (which is in this example common to the light source channel and the first detector channel 142). The orthogonal waves of the second detector channel 143 interfere at a second polarizer P2 145.

The polarization direction of P2 145 is at 90° to that of P1 141. Two of the single-mode fibers 101 (SMF 2 and SMF 3) guide the light to the photo-detectors 12-1 and 12-2.

Preferably there are depolarizers (not shown) such as the Lyot-type fiber above in the two detector channels after the polarizers 141, 145 in order to avoid polarization dependent losses in the path to the photo-detectors. Such loss could give rise to higher sensitivity to mechanical perturbations of the fibers. Instead of the single-mode fibers SMF 2 and SMF 3 two multimode fibers may be used. Due the larger core size (for example 62.5 µm instead of the 9-µm-core of a SMF) the coupling losses from the integrated optical polarization splitter module 14 waveguides into the fibers 101 are reduced.

The polarizers 141, 145 can be thin glass platelets containing oriented metal (e.g. silver particles) to polarize the light. A typical thickness of the platelets is for example 30 µm. As a result of the small thickness the coupling losses between the fiber and the splitter/combiner can be kept small.

A spacer glass platelet 146 with the same thickness as the retarder platelet QWR 144 is used in order to facilitate the assembly of the polarizers P1 141 and P2 145 within the integrated optical module 14. The spacer 146 may consist of glass or can be another QWR platelet with one of its principal axes aligned to the polarization direction of polarizer P1 141, so that it remains inactive and does not affect the polarization of the transmitted light. The spacer 146 can also be a second polarizer platelet with the same orientation as polarizer P1 141, which further enhances the degree of polarization.

Preferably, the QWR 144 is of low order and thus of small thickness (typically a few tens of micrometers). This again helps to limit optical coupling losses.

The use of a common polarizer P1 141 for the source light and the first detector channel 142 also facilitates the assembly of the integrated optical module 14, as the waveguides are typically separated at its source side face by only a few 100 µm.

The orientation of P1 141 at 45° to the normal of splitter/combiner SC 140 and hence the PM fiber 132 axis orientation parallel to the splitter/combiner normal is preferred (over an alignment of, e.g., P1 at 0° or 90° and thus a fiber axes at 45° to the SC 140 normal) since potential fiber stress resulting from attaching the PM fiber to the SC tends to be along axes parallel or orthogonal to the SC plane. Disturbing polarization cross-coupling is then minimized.

The integrated optical module 14 is preferably part of the sensor head assembly 13. It can be temperature-stabilized as described further below. An important advantage of the configuration of FIG. 1 is that the opto-electronics module 11 can be connected with the sensor head 13 by standard single-mode fibers (or multimode fibers) and standard fiber connectors 102. The more challenging use of a polarization-maintaining fiber for this connection can thus be avoided. This is particularly of advantage, if the distance from the opto-electronics module 11 and sensor head 13 is relatively large and connectors 102 on both ends of the fiber cable are desired (for example when the sensor head 13 is in the yard of a high voltage substation and the opto-electronics module 11 including the light source 111 in the substation control house with distances of up to several 100 m in between).

In contrast, the decreasing polarization extinction ratio (PER) of a polarization-maintaining link at increasing cable lengths limits the possible cable length. Furthermore, PM fiber connectors tend to reduce the PER (polarization extinction ratio) in a temperature dependent way and thus can reduce the stability of the sensor scale factor. Also, the cost of PM fiber and PM fiber connectors is substantially higher that the cost of standard singlemode or multimode fibers and corresponding connectors.

To achieve accuracy under varying circumstances, sensor configurations of the type described above in FIG. 1 or further below (FIGS. 5-8) are best operated using a signal processing method which is adapted to compensate for asymmetries between the two or more detection channels, as will be described in the following. It should be understood that this signal processing method can be applied to various optical sensors with two or more detection channels and with a static bias optical phase shift as introduced by a passive optical element.

Using for example the configuration of FIG. 1 above as reference and assuming ideal components (perfect angular alignment of the components, no cross-coupling between the two orthogonal polarization modes, no asymmetric optical loss in the two detection channels, sensing fiber free of linear birefringence), the two detector signals as a function of the magneto-optic phase shift $\Delta\phi$ are given by $$S_1 = (S_0/2)(1+\sin \Delta\phi) \tag{1}$$

$$S_2 = (S_0/2)(1-\sin \Delta\phi) \text{ with} \tag{2}$$

$$\Delta\phi = 4NVI. \tag{3}$$

Here, N, V, I are the number of windings of the fiber coil, the Verdet constant of fiber (~1 μrad/A at 1310 nm), and the current, respectively. $S_0$ is proportional to the light source power.

The difference of the two signals divided by their sum gives a signal S independent of the light source power:

$$S = (S_1 - S_2)/(S_1 + S_2) \text{ or} \tag{4}$$

$$S = \sin \Delta\phi. \tag{5}$$

For $\Delta\phi \ll 1$ (which often is the case in practice) S varies linearly with $\Delta\phi$:

$$S = \Delta\phi. \tag{6}$$

In a practical sensor the optical power loss in the two detection channels may differ, e.g. as a result of different coupling loss from the splitter to the fibers SMF2 and SMF3 or due to different loss at fiber connectors. Furthermore, the interference fringe visibility of the two channels may differ as result of tolerances in the relative alignment of the polarizers P1 and P2. The phase difference between the interfering light waves may not be exactly 90° due to the temperature dependence of the quarter wave retarder in the two detector channels. Residual birefringence, e.g. due to temperature-dependent stress in the two channels, may introduce further phase offsets. Under these conditions the signals $S_1$, $S_2$ in channel 1 and 2, respectively, are given as $$S_1 = (S_{01}/2)[1+K_1 \sin(\Delta\phi+\alpha(T)+\eta(T))] \text{ and} \tag{7}$$

$$S_2 = (S_{02}/2)[1-K_2 \sin(\Delta\phi+\alpha(T)+\kappa(T))]. \tag{8}$$

Here, $K_1$ and $K_2$ indicate the fringe contrast in the channel 1 and 2, respectively ($K_1$ and $K_2$ are equal to unity under ideal conditions and smaller than unity otherwise). The term $\alpha(T)$ describes the deviation of the retardation of the QWR 144 from 90° and its variation with temperature. The terms $\eta(T)$ and $\kappa(T)$ describe phase offsets due to other birefringence in the polarization splitter module 14 in channel 1 and channel 2, respectively.

Using the thus introduced parameter, an example of a method to compensate for differential optical losses between the detector channels 1 and 2 is described in the following.

Different optical loss in the different detector channels is commonly the most severe of the above mentioned perturbations. For the following considerations it is assumed that $K_1 = K_2 = K$. For simplicity it is further assumed that K=1 (the following considerations are also valid for K<1, however). It is further assumed that the current to be measured is an alternating current (AC) or a transient current (e.g. a current pulse). The measurement of current pulses is of interest for example in the monitoring of correct current commutation in DC breakers (see ref. [5] for details), in the detection of lightning, plasma physics and other. In the following, examples of three different methods, which can be referred to as AC, transient and DC methods, respectively, are described to account for differential channel loss.

In the first of the following examples (FIGS. 2A to 2C), the compensation method uses a processed part or representation of the AC signal content. This method is generally preferred for applications with periodic AC currents such as 50 Hz or 60 Hz line currents. Use is made of the knowledge that the amplitudes of the AC contents must be the same in the two channels (apart from being anti-phase) to normalize the two channels to equal signal levels.

Figure 2A:
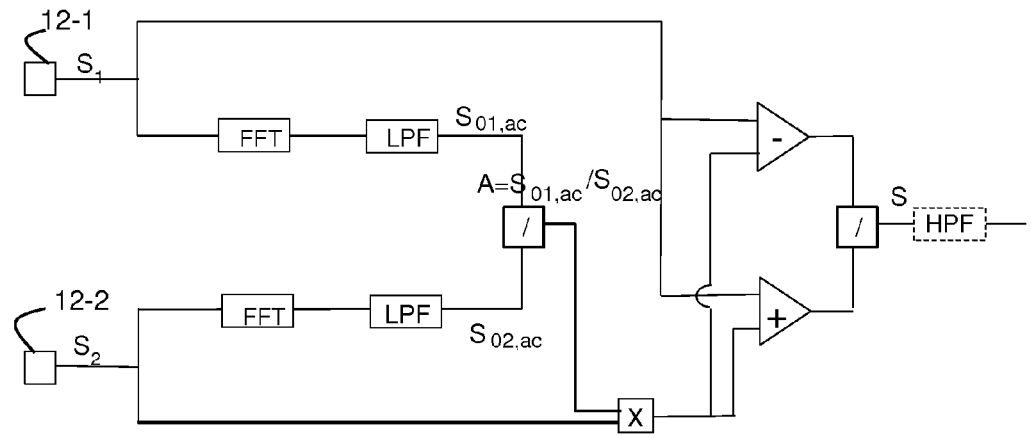
FIGS. 2A-2C illustrate examples of signal processing steps in accordance with a further aspect of the invention.
Figure 2B:
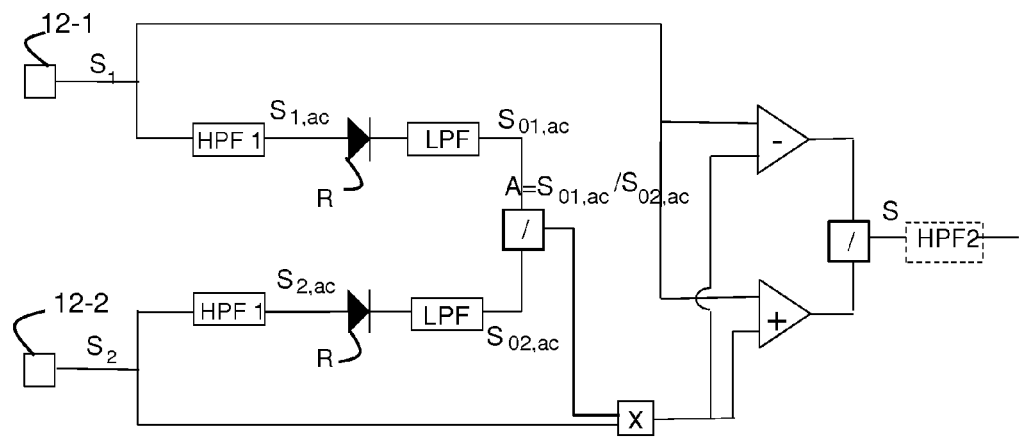

In a preferred arrangement, the largest AC amplitudes $S_{01,ac}$ and $S_{02,ac}$ in a certain frequency range, e.g. between 45 Hz and 65 Hz in case of 50/60 Hz AC currents, are determined by means of fast Fourier transformations (FFT), see FIG. 2A. In case of a 50 Hz line current, the FFT will determine the amplitude of the 50 Hz current. The subsequent low pass filters (LPF) serve to average the FFT output for better stability over a time interval determined by the filter cutoff frequency. As an alternative to the series of FFT and LPF, a measure for the amplitudes $S_{01,ac}$ and $S_{02,ac}$ may be determined by a series of a high pass filter (HPF1), a rectifier (R), and a low pass filter as shown in FIG. 2B. The high pass filters cut off the DC signal contents. The rectifiers outputs are then proportional to the amplitudes $S_{01,ac}$ and $S_{02,ac}$ and the low pass filters again serve to time average the signals.

Signal $S_2$ is then multiplied in multiplier (X) by the amplitude ratio $A = S_{01,ac}/S_{02,ac}$ of the two filtered AC signals as generated by the first divider (/). (Alternatively, signal $S_2$ may be left unchanged and signal $S_1$ is multiplied by the amplitude ratio $S_{02,ac}/S_{01,ac}$, i.e. by the inverse of A). After the multiplication, the signals $S_1$ and $S_2$ have the same amplitude, i.e. are normalized to equal power loss. Signal S from eq. (4), which is obtained by combining normalized signals $S_1$ and $S_2$ in the subtracter (−), the adder (+) and the second divider (/) as indicated, is now given as $$S = (S_1 - S_2 A)/(S_1 + S_2 A) \text{ with} \tag{9}$$

$$A = S_{01,ac}/S_{02,ac}. \tag{10}$$

Hence, signal S corresponds to signal of an ideal sensor:

$$S = \sin \Delta\phi. \tag{11}$$

Figure 2C:
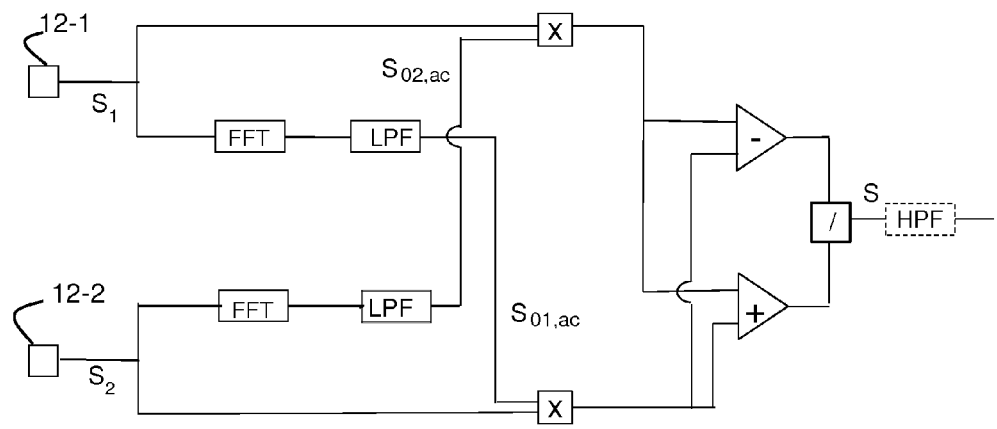

FIG. 2C shows a modification of the method illustrated by FIG. 2A. Here, signal $S_1$ is multiplied in a multiplier (X) with amplitude $S_{02,ac}$ and signal $S_2$ is multiplied in a second multiplier (X) with amplitude $S_{01,ac}$. As a result signals $S_1$ and $S_2$ are again normalized to equal power loss. An advantage over the methods as illustrated by FIGS. 2A and 2B can be seen in that the normalization does not require any signal division and hence requires less signal processing power.

In eq. (9)-(11) above the phase offsets $\eta$ and $\kappa$ are assumed to be negligible. Also it should be noted that the particular value of $\alpha$ (deviation of the QWR retarder from 90°) does not affect the recovered phase shift as long as $\alpha \ll 1$.

In the case of AC or transient current the measurement signal S after the second divider (/) can advantageously be high pass filtered, as indicated by the filters HPF, HPF2 shown dashed in FIGS. 2A-2C.

The cutoff frequency is chosen sufficiently small so that the system is able to detect all desired AC and transient content. In case of a 50 Hz or 60 Hz current the cutoff frequency may be chosen for example in the range between 0.001 Hz and 10 Hz. With a low cut-off frequency (e.g. 0.001 Hz), it is possible to detect transient dc in the current that may occur in case of certain faults. The HPF1 cutoff frequency in FIG. 2B may be the same as the HPF2 cutoff frequency or the two frequencies may differ, e.g. the cutoff frequency of HPF1 may be closer to the rated AC frequency than the cutoff frequency of HPF2. The LPF cutoff frequency (or equivalently the time span over which the ratio A is averaged) is best chosen such that on one hand random fluctuations of A due to signal noise are kept small, and that on the other hand the response to optical power variations, e.g. as a result of temperature variations or fiber movement, is sufficiently fast. An appropriate averaging time may be in the range between 1 s and 100 s (seconds). A preferred value is in the range of 1 s to 20 s.

Instead of the high pass filters HPF1 in FIG. 2B, band pass filters centered around the rated current frequency can be used.

Advantages of the normalization via the AC signal contents as described above can be summarized as follows:

The method also works for AC currents with DC offset.

Changes of the QWR 144 with temperature ($\alpha$-change) do not affect the normalization.

Phase offsets $\eta(T)$ and $\kappa(T)$, due to other birefringence of the polarization splitter module, do not affect the normalization (provided they are sufficiently small, preferably $<\sim 5°$).

Various modifications of the schemes in FIGS. 2A-2C are possible. For example in the method of FIG. 2A, the two input signals of the adder (+) can be low pass filtered in order to lower the noise in the adder's output.

With some modification the compensation methods as described above can also be applied to the case of transient currents, such as current pulses. The ratio A is then determined by dividing in the divider (/) the instantaneous (digital or analog) outputs of the two high pass filters HPF1 (FIG. 2B). The HPF1 cutoff frequency is adapted to the expected current rise and fall times. Preferably, the normalization is only active as long as the current is above a set threshold in order to avoid erroneous normalization due to signal noise. Below the threshold, a preset default value of A or the last valid value of A may be used.

Figure 3:
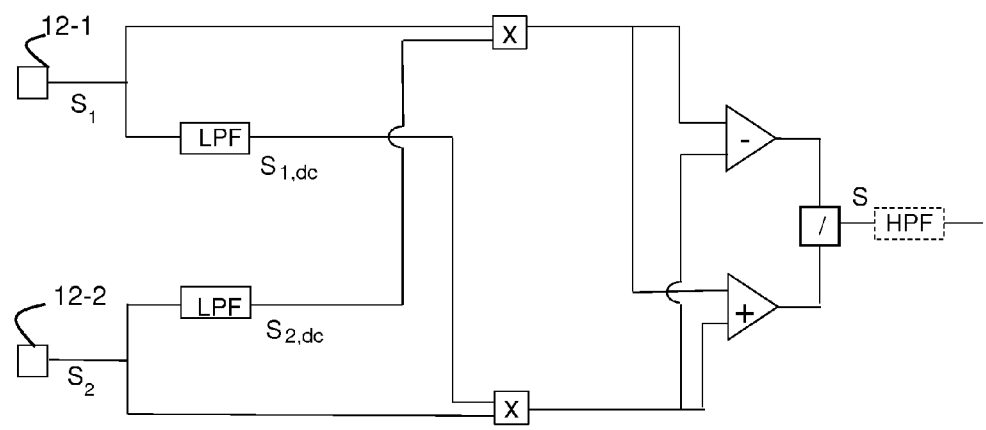
FIG. 3 illustrates a variant of the examples of FIGS. 2A-2C making use of DC parts of the signal.

In FIG. 3 there is described a DC based method for compensating the asymmetry between different detector channels.

Here, the DC signal contents $S_{1,dc}$ and $S_{2,dc}$ are used to normalize the signals with regard to differential optical loss. This method is preferred in case of transient currents such as current pulses which may occur at random times, i.e. the method may be used when no AC signal part is available for normalization. A condition is that there is also no continuous dc current of significant magnitude flowing as dc would introduce anti-phase offsets in the two signals, which would distort the normalization. Non-negligible phase offsets $\alpha(T)$, $\eta(T)$, and $\kappa(T)$ will affect the accuracy of the procedure. If the sum of the offsets is determined by an independent measurement, the offsets can be taken into account by multiplying one of the Signals $S_1$, $S_2$ with an appropriate correction factor.

As an alternative to dividing the difference by the sum of the signals in FIGS. 2A-2C (which, as noted, has the drawback that the division requires significant signal processor power), it is also possible to keep the sum signal after the adder (+) at constant level by means of a controlled amplifier in a closed loop feedback circuit. The difference signal after the subtractor (−) is then multiplied by a factor (1/b(t)), wherein b(t) is the amplification factor (which may vary over time and temperature) that keeps the sum signal at constant level.

Any of the above methods are best implemented in combination with temperature compensation means. Such a temperature compensation can be achieved through a temperature controlled environment and/or through an extraction of the temperature from at least one detector signal, examples of which are described further below.

Alternatively or in addition, a method as described in reference [3] for fiber coils free of linear birefringence or of low birefringence can be used. Here, the temperature dependence of a retarder such as the fiber retarder 133 at the beginning of the sensing fiber 131 as shown in the example of FIG. 1 is employed to compensate the temperature dependence of Faraday effect. Instead of eq. (6) the signal is then given by $$S=[\cos \varepsilon(T)]\Delta\phi. \tag{12}$$

The angle $\varepsilon$ is an appropriately chosen deviation of the retarder 133 from perfect $\pi/2$-retardation at a reference temperature, e.g. room temperature. The term $\cos \varepsilon(T)$ decreases at increasing temperature in a way largely balancing the increase in the Verdet constant V with T in the term $\Delta\phi=4NVI$.

Modifications of the method in the cases of sensing fiber with non-negligible linear birefringence have been described for example in reference [6] for the case of interferometric current sensors according to reference [1].

However, apart from applying one or a combination of the above methods of using a detuned retarder to compensate for temperature induced shifts of the signal, the method can be extended in the case of AC measurements to include a further method for determining the temperature of the passive elements, such as the integrated optical module 14 above. It should be noted that this method can be applied to many different optical sensors for an AC or transient measurand and can thus be considered an independent aspect of the present invention. Further embodiments of optical sensors that can use this invention are described further below.

Figure 4:
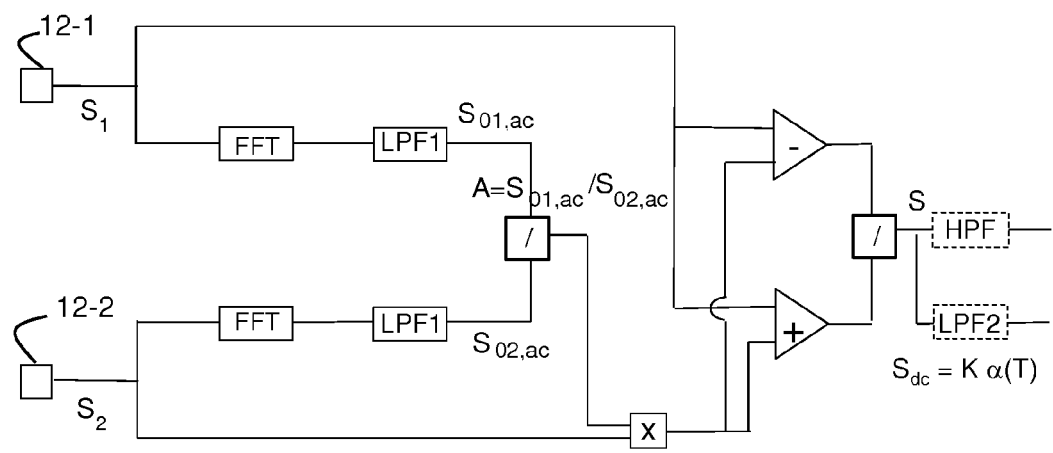
FIG. 4 illustrates an example of signal processing steps in accordance with a further aspect of the invention.

In case of AC or transient currents, the temperature of the QWR 144 can be extracted from the low pass filtered sensor output, preferably after normalization of the detector signals by means of the AC signal contents as shown in FIG. 4, which also includes the elements already described when referring to FIG. 2A above. The sensor signal S is given by $$S=K \sin(\Delta\phi_{ac}+\alpha(T)), \tag{13}$$

where $\Delta\phi_{ac}$ is the magneto-optic phase shift produced by the AC current. The terms $\eta(T)$ and $\kappa(T)$ are assumed as sufficiently small and the fringe contrast K is assumed as being equal for the two channels. The DC signal content is obtained by low pass filtering (LPF2 in FIG. 4) as $$S_{dc}=K \sin(\alpha(T)) \tag{14}$$

Since the deviation of the retarder from 90° is typically small, eq. (14) is approximately given as $$S_{dc}=K\alpha(T) \quad (15)$$

It can be a requirement for this to imply that phase shifts from potential dc currents are small compared to $\alpha$ over the LPF2 signal averaging time.

If the integrated optical module and the sensing element are in a common housing or exposed to the same or similar environmental conditions, $S_{dc}$ can serve also as a measure for the sensor head 13 temperature and can be used to compensate any (remaining) variation of the sensor head scale factor with temperature.

The quarter wave retarder QWR 144 of the integrated optical module 14 is commonly a quartz-platelet. In case of a zero-order platelet the retardation varies by about 0.5° over a temperature range of 100° C. at a wavelength of 1310 nm. For a temperature measurement it can be advantageous to use a higher order retarder, because the variation of $\alpha$ with temperature increases in proportion to the retarder thickness. Ideally, the variation should be significantly larger than any potential contribution from the terms $\eta(T)$ and $\kappa(T)$. Even with non-negligible terms $\eta(T)$ and $\kappa(T)$ the temperature can still be determined from the output of LPF2, as long as the signal varies monotonically with changing temperature and is appropriately calibrated in terms of temperature.

Because of the sinusoidal signal vs. phase shift characteristics, a linearization of the sensor signal as represented by eq. (13) can be included in the signal processing. Furthermore, deviations of the bias phase shift from 90°, particularly the influence of temperature on $\alpha$, can be taken into account for this linearization as a zero-point correction. In particular, in the case of AC or transient currents, $\alpha(T)$ as retrieved from $S_{dc}$ (see eqs. (14) and (15)) can be included in the determination of the AC phase shift $\Delta\phi_{ac}$ from the signal S (according to eq. [13]).

DC content that is generated by rectifying the AC current, e.g. in HVDC transmission systems or in electro-chemical processes (for example electro-winning of aluminum), often still contains harmonics of the AC line frequency. Therefore, compensation of different loss in the detection channels via the AC signal contents as described above (FIGS. 2A-2C) may also be applied to measure such DC content. For this purpose one of the signal processing schemes of FIGS. 2A-2C is again used, but without the final high pass filter HPF 2. The sensor output S is given by:

$$S=K(\Delta\phi+\alpha(T)+\eta(T))+\kappa(T)) \quad (16)$$

Here, it is again assumed that the (magneto-optic) phase shift $\Delta\phi$, containing both DC and AC contents, is much smaller than 1, and the interference contrast K is the same for the two channels. The uncertainty in the DC measurement is then mainly given by the phase terms $\alpha(T)$, $\eta(T)$, and $\kappa(T)$. With a temperature stabilized integrated optical module as described below the phase terms can be kept stable. Their sum as well as the contrast K can be determined by calibration.

Residual temperature-dependent stress, e.g. from adhesives, that can cause unwanted birefringence in the polarization splitter module 14, in particular at the retarder, can remain as a limitation of the sensor accuracy. Such stress may affect the contrast terms $K_1$ and $K_2$ through polarization cross-coupling between the interfering light waves as well as the phase terms $\eta(T)$ and $\kappa(T)$ as referred to in the equations (7), (8) above.

Sensor applications in high voltage substation require often accuracy within <±1% for protection and <±0.2% for metering. While the above measures commonly suffice for protection accuracy, they may not suffice for metering accuracy over an extended temperature range. In a high voltage substation ambient temperatures may vary e.g. between -40° C. and 55° C. But a sensor may also encounter even more severe temperatures or temperature differences, e.g. due to heating by the current.

Figure 5:
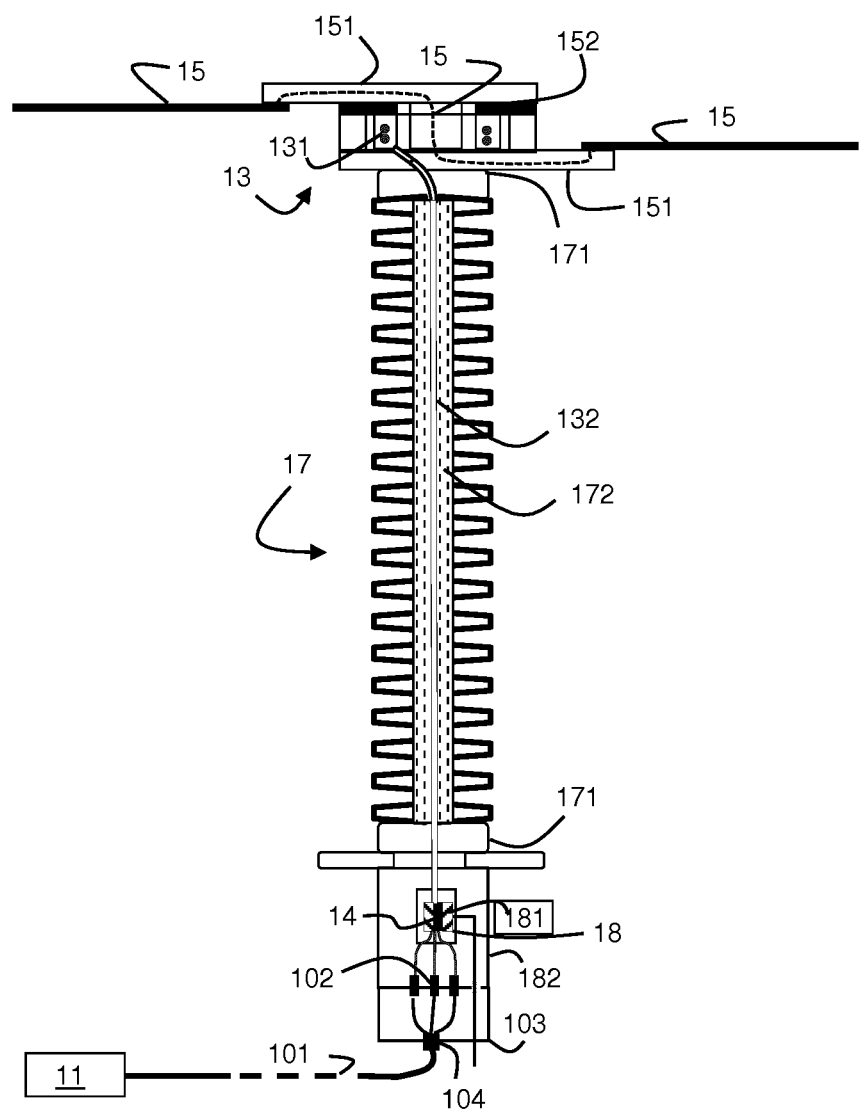
FIG. 5 shows further elements of a sensor for use in a high-voltage environment.

The example of FIG. 5 shows an arrangement of a sensor according to FIG. 1, wherein influences of the integrated optical polarization splitter module 14 on the scale factor stability over temperature are essentially eliminated. In the exemplary configuration the sensor head 13 is located at the high electric potential side of a free-standing electric insulator 17, i.e. the insulator and sensor head 13 represent a free-standing device equivalent to a conventional instrument current transformer. The integrated optical polarization splitter module 14 is positioned at the ground potential side of the insulator 17 and is connected with the fiber coil 131 by a polarization-maintaining fiber link 132. The link 132 runs through the hollow-core of the insulator 17. The arrangement maintains the advantage of single-mode (or multimode) fiber links between the location of the insulator 17 and hence the integrated optical polarization splitter module 14 and the opto-electronic module 11 of the sensor 131. The PM fiber link 132 only extends over the distance from ground to high voltage potential.

With the integrated optical module 14 being separated from the coil 131 and located at ground potential its temperature can be stabilized without protection against high voltage effects. Preferably, the temperature of the integrated optical module 14 is kept at a temperature that corresponds to or is near the highest temperature of operation. For example, if the maximum temperature of operation (maximum ambient temperature) is 65° C., the integrated optical module 14 can be kept in the range between 65° C. and 45° C. at ambient temperatures between 65° C. and -40° C. Hence, the temperature control requires only provisions for heating but none for cooling.

The integrated optical module 14 may be placed in a thermally insulated package or housing 18 as shown. In the simplest case the temperature is stabilized by means of a self-regulated heating foil resistor 181. The resistor material has a strong positive thermal coefficient and acts as a "thermal diode". As a result the heat power at a given voltage (for example 24 V) is high at low temperatures, gradually decreases with increasing temperature, and approaches zero at a designable threshold, e.g. 65° C. A regulating electronic circuit is not needed in such an implementation. Alternatively, the temperature may be stabilized by means of one or several heating resistors (not shown) with the current controlled by electronics.

In a further exemplary arrangement the temperature of the integrated optical module 14 can be controlled by means of a thermo-electric cooler/heater that is able to maintain an arbitrary constant temperature, e.g. 25° C.

The insulator 17 is a hollow-core insulator consisting of hollow fiber reinforced epoxy tube. Silicone sheds on the outer surface provide sufficient creepage distance between high voltage and ground to prevent flash-over, e.g. in case of pollution by rain water or dirt. The PM fiber 132 is for example protected by a fiber cable comprising an inner gel-filled tube that contains the fiber. The gel filling prevents excessive fiber stress and thus unwanted polarization cross-coupling between the two orthogonal polarization modes, e.g. due to differential thermal expansion.

The insulator bore is filled with a soft insulating material 172, e.g. silicone, which provides sufficient dielectric strength. The silicone contains a filler material which has sufficient compressibility and accommodates any thermal expansion of the silicone. The filler can for example consist of micron sized beads made of a soft material or of tiny fluid bubbles or gas bubbles. The bubbles may contain sulfur hexafluride ($SF_6$) gas or alternative dielectric insulation fluid mixtures or gas mixtures comprising an organofluorine compound, such organofluorine compound being selected from the group consisting of: a fluoroether, an oxirane, a fluoroamine, a fluoroketone, a fluoroolefin, and mixtures and/or decomposition products thereof. The dielectric insulation medium can further comprise a background gas different from the organofluorine compound and can in embodiments be selected from the group consisting of: air, $N_2$, $O_2$, $CO_2$, a noble gas, $H_2$; $NO_2$, $NO$, $N_2O$; fluorocarbons and in particular perfluorocarbons, such as $CF_4$; $CF_3I$, $SF_6$; and mixtures thereof.

Alternatively, the insulator 17 can be filled with polyurethane foam and/or contain an insulating gas such as nitrogen ($N_2$) or sulfur hexafluoride ($SF_6$) or alternative dielectric insulation gas mixtures comprising an organofluorine compound, such organofluorine compound being selected from the group consisting of: a fluoroether, an oxirane, a fluoroamine, a fluoroketone, a fluoroolefin and mixtures and/or decomposition products thereof. The dielectric insulation gas can further comprise a background gas different from the organofluorine compound and can in embodiments be selected from the group consisting of: air, $N_2$, $O_2$, $CO_2$, a noble gas, $H_2$; $NO_2$, $NO$, $N_2O$; fluorocarbons and in particular perfluorocarbons, such as $CF_4$; $CF_3I$, $SF_6$; and mixtures thereof. The gas can be at atmospheric pressure or at elevated pressure to enhance its dielectric strength.

In another example the insulator can include of a solid inner rod of fiber reinforced epoxy with the PM fiber running inside a capillary along a helical path along the outer surface of insulator rod as disclosed for example in reference [8].

The temperature stabilized housing 18 containing the integrated optical module 14 can be mounted for example in an external housing 182 that is attached to the insulator flange 171 as shown. The external housing 182 protects the fiber leads of the integrated optical module 14 and is equipped with fiber connectors 102 for the fiber cable 101 between the sensor opto-electronic module 11 and the HV insulator 17. Furthermore, the external housing 182 acts as a sun-shield and mechanical protection of the integrated optical module 14. A connector shield 103 protects the connectors 102 and has provisions for strain relief 104 of the fiber cable 101.

In FIG. 5 the fiber coil housing or sensor head 13 is horizontally mounted between the terminal plates 151 for the power line cables 15. An insulating layer 152 prevents the current to pass outside the fiber coil 131. In an alternative arrangement (not shown), the fiber coil can be mounted in a vertical position on top of the insulator with the current passing the coil in horizontal direction.

Instead of mounting the fiber coil housing or sensor head 13 on a free-standing insulator 17 the housing can also be attached to the terminal of a high voltage circuit breaker. In this case the polarization maintaining fiber link to ground may be designed as a flexible high voltage fiber cable equipped with sheds to enhance the creepage distance. The temperature controlled splitter can then be mounted in the breaker drive cubicle or in a separate enclosure nearby.

As another alternative the fiber coil housing or sensor head 13 can also be mounted inside the circuit breaker on top of the circuit breaker support insulator, as described for example in reference [9]. Here the PM fiber link runs to ground through the gas volume (with any dielectric insulation medium as disclosed above) of the support insulator and leaves the support insulator through a gas-tight fiber feed-through. The temperature controlled module 14 can again be mounted in the breaker drive cubicle or in a separate enclosure nearby. Further alternatives to mount the fiber coil housing or sensor head 13 in high voltage circuit breakers are disclosed in reference [10].

In still further applications, current may be measured on ground potential with sensor arrangements equivalent to the ones as disclosed earlier for gas-insulated high voltage switchgear (GIS) (see for example reference [11] for further details), generator circuit breakers (see for example reference [12] for further details), or bushing of a HVDC converter station (see for example reference [13] for further details). In such applications, both the fiber coil 131 and the temperature controlled integrated optical module 14 according to the above examples of the present invention can be mounted on ground potential. No particular high voltage insulation of the PM fiber link between the two components is needed in such applications.

The effects of having the fiber coil 131 and the integrated optical module 14 separated and the latter temperature stabilized is shown in the comparison of FIGS. 6A and 6B, which show the scale factor variation versus the sensor head temperature for the cases that the both the fiber coil 131 and module 14 are exposed to the same temperature (FIG. 6A) and that the module 14 is temperature-stabilized according to the methods proposed herein (FIG. 6B). In addition, the fiber coil 131 is temperature compensated by means of the fiber retarder 133 (as described in detail when referring to eq. (12)). The remaining scale factor variation between −40 and 85° C. is reduced from about 0.5% to ±0.1% and thus meets common requirements for metering (±0.2%).

As mentioned, any of the above-described methods for normalization and temperature stabilization can be applied to different types of optical sensors, which can be similar or different from the sensor described in connection with FIGS. 1 and 5. Examples of other possible optical sensor configuration having a passive element to introduce a static bias optical phase shift between two detector channels are described in the following. It should be noted that the examples presented are only representative and the application of the above methods is not limited to them.

Figure 7A:
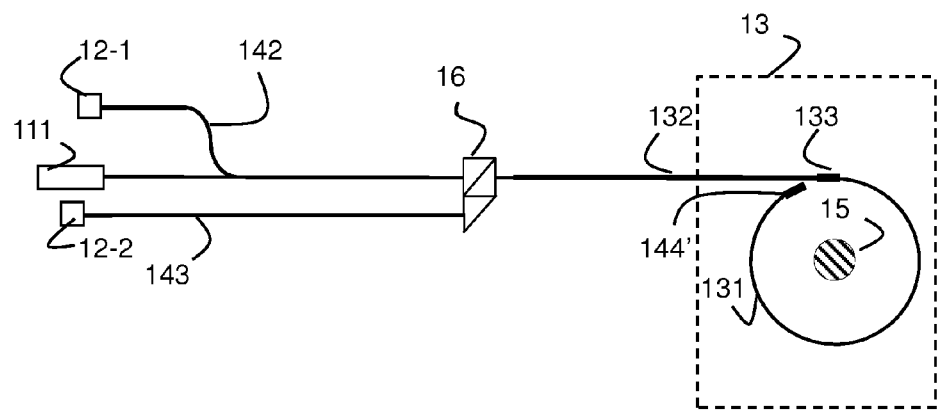
FIGS. 7A-7B show further sensor configurations for possible applications of examples of the present invention.

In the example of a fiber-optic current sensor given in FIG. 7A, the element to introduce a static bias optical phase shift is a Faraday rotator, in particular, a Faraday rotation mirror 144' located at the end of the sensing fiber 131. The generally temperature dependent single pass rotation angle of the Faraday rotator $\beta(T)$ is related to the quantity $\alpha(T)$ in eq. (7), (8) via $90°+\alpha(T)=4\beta(T)$, i.e. optimum sensitivity is achieved by setting $\beta(T_0)$ at a reference temperature $T_0$, e.g. room temperature, to ±22.5°. The conversion of the phase shift to optical power changes of opposite phase in two output channels 142, 143 is achieved by a polarizing beam splitter 16. Stress and misalignment at the polarizing beam splitter 16 can yield quantities $K_1(T)$, $K_2(T)$ in eqs. (7) and (8) deviating from 1 and quantities $\eta(T)$ and $\kappa(T)$ in eqs. (7) and (8) deviating from zero.

There are two options as to how the sensor shown in FIG. 7A can be operated. In a first option two orthogonal linear polarization states are sent through the PM fiber 132 to the sensing fiber 131 and converted by means of a fiber retarder 133 to left and right circular light waves at the entrance to the fiber sensing fiber 131. In the second option, only one linear polarization state, generated at the polarization splitter, is sent through the PM fiber 132 and further (without conversion into circular polarization) into the sensing fiber 131. The current signal can be retrieved from the detected light powers in the same way as in the previous sensor embodiment of FIG. 1, with the two detector channels 142, 143 being formed by the two signals as generated when the light from the sensing fiber 131 passes through beam splitter 16. Temperature stabilization of elements 16 and 144' as described in this invention improves the temperature stability of the sensor signal.

A third example of a fiber-optic current sensor with passive optical elements and also having a sensor characteristic according to eq. (7) is described in the following.

Figure 7B:
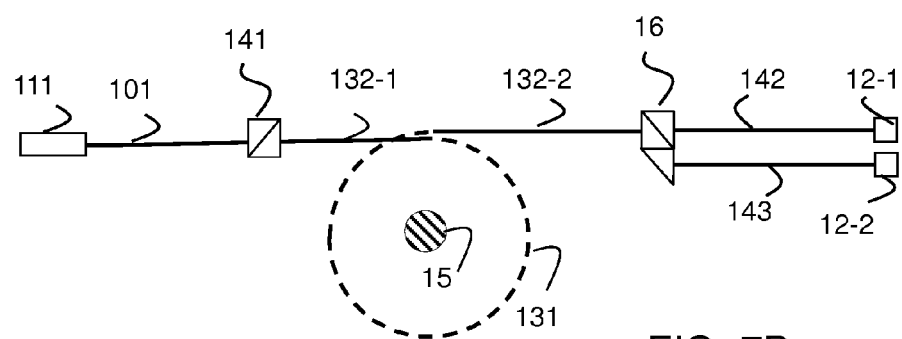

This transmission-type sensor configuration is schematically depicted in FIG. 7B. The linear polarizer 141 generates linearly polarized light that is injected into the sensing fiber 131 (in this example a principal axis of the PM fiber pigtail 132-1 is parallel to the polarizer orientation). The magneto-optic phase shift in the sensing fiber 131 becomes manifest as a rotation of light polarization. The phase biasing through a passive element 144 is here achieved by the orientation of the polarizing beam splitter 16 at ±45° to the axis of the first linear polarizer 141 (the axes of the PM fiber pigtail 132-2 of the polarizing beam splitter 16 are also oriented at ±45° with respect to the axis of the first polarizer 141) which also splits in the incoming light into two orthogonal linear polarization states. The detected light power in the two channels 142, 143 is again described by eqs. (7) and (8) with Δϕ being smaller by a factor of 2 compared to the previous examples since the sensing coil 131 is only passed once. The quantities $K_1(T)$, $K_2(T)$ in eqs. (7) and (8) can deviate from 1 and quantities $\alpha(T)$, $\eta(T)$ and $\kappa(T)$ can deviate from 0 due to imperfections of the linear polarizer 141, the polarizing beam, or their relative angular orientation. Temperature stabilization of element 16 as described in this invention improves the temperature stability of the sensor signal.

As already mentioned, application of the accuracy enhancements of the present invention are not limited to fiber-optic current sensors as described in the examples of FIGS. 1, 5 and 7A-7B, as the various aspects of the present invention can also be applied to other sensors that rely on the measurement of an optical phase shift.

Figure 8:
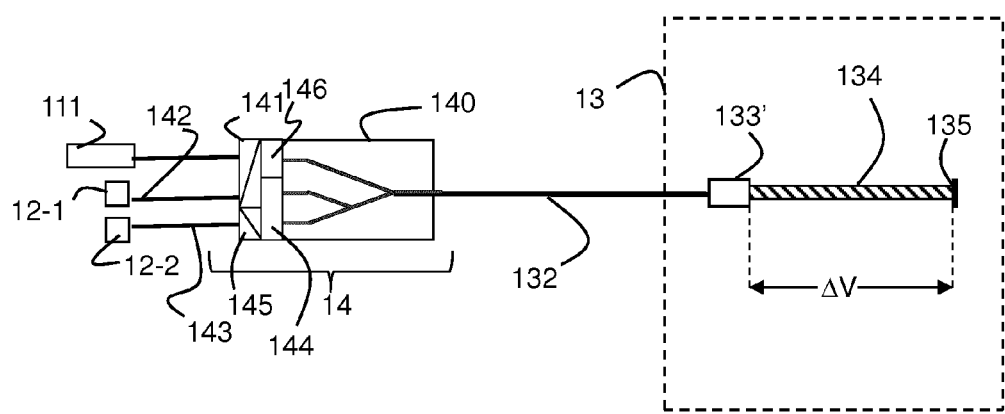
FIG. 8 shows a further sensor configuration for possible applications of examples of the present invention in the field of voltage sensing.

For further illustration, FIG. 8 depicts an optical voltage sensor to which the above methods can be applied.

The general arrangement and components of a corresponding configuration employing active phase modulation are for instance described in further detail for example in reference [16] (see also references [17, 18]). The detection system comprises to a large extent the same components as the first example of a fiber-optic current sensor employing an integrated optical polarization splitter module 14, as already described when referring to FIG. 1 above. However, the sensing coil 131 (fiber retarder, sensing fiber, fiber tip reflector) is replaced by an electro-optic element 134 terminated at the far end by a reflector 135, and at the near end by a 45°-Faraday rotator 133'. The reflector 135 can be implemented using, e.g., a mirror, a reflective coating, a reflective prism, or a corner cube reflector.

As shown in FIG. 8, the voltage to be measured is applied over the length of the electro-optic element 134. The electro-optic element 134 can be a rod shaped electro-optic Bi3Ge4O12 (BGO) crystal 134. Instead of a bulk electro-optic crystal an electro-optic fiber 134 may be used, such as a crystalline fiber 134 as described in reference [19] or an electrically poled fiber 134 as described in reference [20]. The Faraday polarization rotator 133' at the electro-optic element's near end rotates the two orthogonal light waves emerging from PM fiber 132 by 45° before they enter the electro-optic crystal. The polarization directions after the rotator 133' coincide with the electro-optic axes of the crystal 134. The light is reflected at the far end of the crystal 134 by means of reflector 135. The two orthogonal light waves experience a differential electro-optic phase shift in the crystal 134 that is proportional to the applied voltage. The Faraday rotator 133' rotates the returning light waves by another 45° so that the total roundtrip polarization rotation corresponds to 90°. (The polarization rotation is needed so that the roundtrip group delay of the orthogonal polarization states in PM fiber 132 is zero and the two waves are again coherent when they interfere at the polarizers 141, 145)

The electro-optic phase shift is extracted analogously to the magneto-optic phase shift of the fiber-optic current sensor of FIG. 1. To retrieve the signal from the light power measurement in the two photo detector channels 142, 143, the accuracy enhancing aspects of the invention as already discussed in further details and examples above can be applied as in the case of fiber-optic current sensors. In particular, the temperature stabilization of the integrated optical polarization splitter module 14 increases the signal stability analogously to the case of the fiber-optic current sensors. Note that instead of the electro-optic sensing element 134 as illustrated in FIG. 8, other designs of the voltage sensing element as described in Ref. 16 may be used, as well.

The various aspects of the present invention can analogously be applied to an optical voltage sensor based on the piezo-electric effect in materials such as quartz. The quartz element(s) strain(s) an attached PM sensing fiber in the presence of an applied voltage and as a result introduce(s) again a voltage-dependent phase shift between the orthogonal polarization states of the sensing fiber (see ref. [16, 7] for further details). The PM sensing fiber may also in similar manner act as a sensor for strains or forces of other origin.

While there are shown and described presently preferred embodiments of the invention, it is to be understood that the invention is not limited thereto, but may be otherwise variously embodied and practiced within the scope of the following claims.

Particularly, advantageous variations to the above-described examples are the following:

- Preferably, the waveguides of the splitter/combiner 140 are produced by electric-field-assisted ion-exchange which results in negligible birefringence.
- Preferably, the end faces of the splitter/combiner 140 are angle-polished (e.g. at 8° to the propagation direction of the light) in order to minimize back reflections.
- The fast and slow axes of the quarter-wave retarder OWR 144 of the integrated optical module 14 may be oriented at 45° to the fast and slow axes of the pm fiber (instead of parallel or orthogonal alignment). The light after the retarder is then always linearly polarized with a polarization that rotates, if the differential phase of the interfering light waves changes. The detector signals as discussed above remain unchanged, if the polarizers in the two detector channels are then aligned parallel to the fast and slow axes of the pm fiber, respectively, i.e. rotated by 45° with respect to the configurations discussed above. Note that in this case polarizer P1 141 can no longer be common for the source light and the first detector channel 142, as the two polarization directions now differ by 45°.
- Instead of a splitter/combiner 140 a bulk-optic splitter may be used with the quarter-wave retarder 144 and polarizers 141,145 attached to it.
- The fiber coil housing 13, the polarization-maintaining fiber cable 132, and optical module housing 181 may contain for redundancy purposes two or more fiber coils, fibers, and splitters, respectively.

A common light source 111 may be used for several sensor heads 13 (in general n heads). Of particular interest is a common source 111 for a three-phase sensor system. The source light is then split by a 1×n fiber coupler or an integrated-optic 1×n splitter to the individual sensors heads 13.

The signal processing schemes as illustrated in FIGS. 2, 3 and 4 can be implemented as fully digital circuits, as analog circuits, or as mixed analog/digital circuits.

For temperature stabilizing of an AC or transient measurand field it is possible to use just one detection channel to derive a measure for the temperature at the integrated optical module.

It should be noted that the retarder 144 and spacer 146 of the described polarization splitter module can also be interchanged such that the phase bias is introduced before the sensing element 131.

For optical magnetic field sensors or current sensors according to this invention, the sensing element can comprise optical fibers or waveguides, including specialty low birefringent fibers, flint glass fibers, or spun highly-birefringent fibers, bulk magneto-optic materials, such as yttrium iron garnet crystals or fused silica glass blocks, or optical fibers, waveguides, or bulk optical materials attached to a magneto-strictive element or combinations thereof.

In case of temperature stabilization of the element introducing the optical bias phase shift, in principle one detection channel may already be sufficient for AC or transient current measurements. The sensor signal is then determined by dividing the AC or transient detector signal component by the DC signal component.

REFERENCES

[1] K. Bohnert, P. Gabus, J. Nehring, and H. Brändle, "Temperature and vibration insensitive fiber-optic current sensor," Journal of Lightwave Technology, vol. 20, pp. 267-276, 2002.

[2] "The fiber-optic gyroscope", Herve Lefevre, Artech House, Boston, London, 1992.

[3] K. Bohnert, A. Frank, H. Brändle, "Fiber-optic current sensor with polarimetric detection scheme", WO 2007/121592 A1.

[4] Standard of the International Electrotechnical Comission (IEC), IEC60044-8, Instrument transformers—Part 8: Electronic current transformers.

[5] J. Häfner and B. Jacobson, "Proactive Hybrid HVDC Breakers—A key innovation for reliable HVDC grids", in Proceedings of Cigre International Symposium on the electric power systems of the future—Integrating supergrids and microgrids, Bologna, Italy 13-15 Sep. 2011.

[6] R. Wüest, A. Frank, K. Bohnert, "Temperature compensated fiber-optic current or magnetic field sensor with insensitivity to variation in sensor parameters", EP 2 306 212 A1.

[7] K. Bohnert, M. Ingold, and J. Kostovic, "Fiber-Optic Voltage Sensor for $SF_6$ Gas-Insulated HighVoltage Switchgear", Appl. Opt. 38, 1926-1932, 1999.

[8] K. Bohnert, P. Gabus, H. Brändle, "High voltage component with optical fiber and method of producing it", US 2006/0153 509 A1.

[9] U. Akesson, D. Andersson, L. Sköld, Y. Petersson, "Circuit breaker", WO 2008/080878 A1.

[10] C. Piazza, E. Centenaro, K. Bohnert, P. Gabus, H. Brändle, R. Cameroni, "Pole of a circuit breaker with an integrated optical current sensor", U.S. Pat. No. 6,608,481 B1.

[11] K. Bohnert, H. Brändle, "Gas-insulated switchgear device with integrated current sensor", WO 2009/080109 A1.

[12] M. Hochlehnert, T. Lorek, A. Zekhnini, K. Bohnert, A. Frank, "Generator circuit breaker with fiber optic current sensor", WO 2010/012301 A1.

[13] J. Haefner, A. Frank, K. Bohnert, "High voltage AC/DC or DC/AC converter station with fiber optic current sensor", WO 2010/012300 A1.

[14] Kurosawa et al., "Flexible fiber Faraday effect current sensor using flint glass fiber and reflection scheme", IEICE Trans. Electron. Vol. E83-C, 326 (2000) and Optical Fibre Sensors Conference 13, 1999 Apr. 12-16, 1999, Kyongju, Korea.

[15] K. Kurosawa et al., "Development of an optical instrument transformer for DC voltage measurement", IEEE Transactions on Power Delivery, Vol. 8, 1771, 1993.

[16] WO 2008/077255 A1

[17] S. Wildermuth, K. Bohnert, and H. Brändle, "Interrogation of a birefringent fiber sensor by non-reciprocal phase modulation", IEEE Photonics Technology Letters vol. 22, pp. 1388-1390, 2010.

[18] X. Feng, L. Li, X. Wang, C. Zhang, J. Yu, and C. Li, "Birefringence elimination of bismuth germanate crystal in quasi-reciprocal reflective optical voltage sensor", Applied Optics, vol. 52, pp. 1676-1681, 2013.

[19] US 2009/0290165 A1.

[20] US 2011/0050207 A1.

[21] U.S. Pat. No. 5,715,058.

LIST OF REFERENCE SIGNS sensor 10
opto-electronics module 11
light source 111
detectors 12-1, 12-2
signal processing unit 113
sensor head 13
sensing element 131
optical fiber(s) 101
fiber connectors 102
integrated optical polarization splitter module 14
1×3 splitter/combiner 140
polarizer 141
PM fiber 132
quarter-wave (fiber) retarder 133
Faraday rotator 133'
reflector 135
optical detection channels 142, 143
quarter-wave retarder plate (QWR) 144
Faraday rotation mirror 144'
polarizer 145
spacer 146
fast Fourier transformation unit FFT
low pass filter (n) LFP(n)
high pass filter (n) HFP(n)
adder +
subtractor −
divider /
rectifier R
amplitude ratio A
polarizing beam splitter 16
electro-optic element 134 conductor 15
terminal plates 151
insulating layer 152
electric insulator 17
insulator flange(s) 171
insulating medium 172
thermally insulated housing 18
heating foil resistor 181
external housing 182
connector shield 103
strain relief 104

The invention claimed is:

1. A method of detecting an optical phase shift between two sets of light waves induced by a measurand field in a sensing element, the method comprising the steps of:
   passing through said sensing element from a light source said two sets of light waves having different velocities within said sensing element in the presence of a non-vanishing measurand field;
   introducing a static bias optical phase shift between said two sets of light waves;
   converting a total optical phase shift including said static bias optical phase shift and said optical phase shift induced by said measurand field into optical power changes of opposite signs (anti-phase) in at least two detector channels;
   converting the optical power in said at least two detector channels into electric detector signals;
   filtering spectral components from the electrical detector signals of said at least two detection channels and combining said spectral components or a normalization parameter derived therefrom with at least one detector signal to yield normalized detector signals corresponding to an equal optical average power in the absence of said measurand field;
   combining the detector signals of said at the least two detection channels including the normalized detector signals to yield a sensor signal dependent of the total optical phase shift but essentially independent of the intensity of said light source and of different loss or of different gain in said at least two detector channels;
   wherein the filtered spectral components are an AC or transient content of the detector signals and the filtered AC spectral components are time-average; and
   wherein the static bias phase shift is indicative of the temperature of components introducing the static bias optical phase shift or of a sensing element.

2. The method of claim 1, wherein one of: a) the two sets of light waves comprise two different polarization states; and
   b) wherein one or more polarizing elements are used to generate the optical power changes having opposite signs (anti-phase).

3. The method of claim 1, wherein one of: a) the static bias optical phase shift is about (2n+1)×90°, where n is any integer number; and
   b) wherein the static bias optical phase shift is introduced using at least one quarter-wave retarder or a Faraday rotator.

4. The method of claim 1, wherein the sensing element is one of a current or magnetic field sensing element or a voltage or an electric field sensing element.

5. The method of claim 1, wherein one of: a) a Fast Fourier transform (FFT) and a low pass filter (LPF, LPF1) are used to filter time averaged AC spectral components; and
   b) a series of high pass filter (HPF1), a rectifier (R), and a low pass filter (LPF) is used to filter time averaged AC spectral components.

6. The method of claim 1, wherein one of: a) the filtered spectral components are in a range around the nominal frequency of the measurand field; and
   b) wherein an amplitude threshold value for the filtered spectral components is set and filtered spectral components below said threshold or the normalization parameter derived therefrom are replaced by default values or by low pass filtered signal components.

7. The method of claim 1, wherein one of: a) further comprising the step of applying a high-pass filter (HPF, HPF2) to the signal after the combining step; and
   b) further comprising the step of compensating for temperature dependence of the sensing element and/or of further passive components; and
   c) further comprising a linearization of the sensor signal characteristics, in particular by taking into account the static optical bias phase shift.

8. The method of claim 1, further comprising the step of deriving from the sensor signal a further signal representative of the static bias phase shift.

9. The method of claim 1, wherein one of: a) the step of deriving a signal representative of the static optical phase bias includes splitting the sensor signal into a total phase shift channel and a static bias phase shift channel and applying a low pass filter (LPF2) to the static bias phase shift channel; and
   b) the method includes a further temperature compensation as provided by a retarder coupled to the sensing element.

10. An optical fiber current or magnetic or voltage or electric field sensor comprising a signal processing unit including inputs for each of the signals as measured by two or more detectors and filters and at least a light source and at least two or three optical transmission channels, with one channel providing a forward channel for the light to a sensing element and one or two channel(s) providing return detector channel(s) for the light to the detector(s), one or more passive optical elements for introducing a static bias optical phase shift between two different sets of light waves having different velocities within said sensing element in the presence of a non-vanishing measurand field, and for converting a total optical phase shift including said static bias optical phase shift and an optical phase shift induced by the measurand field into changes of optical power, the optical power being in the case of two detector channels of opposite signs (anti-phase), and a polarisation maintaining (PM) fiber being connected directly or indirectly via at least one retarder or Faraday rotator element to said sensing element, wherein at least parts of said one or more passive optical elements are in thermal contact with a temperature stabilizing unit providing a controlled temperature environment for said one or more passive optical elements wherein the temperature stabilizing unit comprises at least one self-regulated heating resistor, wherein the one or more passive optical elements are at ground potential and wherein the PM fiber provides an optical connection from ground potential to the potential of the sensing element being different from the ground potential, and wherein the PM fiber passes through the interior of an insulator column and the insulator column is a hollow core insulator filled with an insulating fluid or gel surrounding the PM fiber.

11. The sensor of claim 10, wherein the one or more passive optical elements for introducing a static bias optical phase shift and the one or more passive optical elements converting a total optical phase shift are combined in an integrated optical polarization splitter module with at least three ports on the optical source/detector side and one port on the sensing element side, with said port on the sensing element side being connected to the PM fiber.

12. The sensor of claim 10, wherein one of: a) the sensing element comprises a sensing fiber to be looped around a conductor and to be in operation exposed to a magnetic field of a current in said conductor; and
   b) the sensor being a sensor for measuring DC current; and
   c) the sensing element comprises one of an electro-optical crystal or an electro-optic fiber or an optical fiber attached to a piezo-electric material.

13. The sensor of claim 10, wherein said fluid or gel comprising silicone or silicone with a compressible filler material, or a gas.

14. The sensor of claim 10, wherein the insulating fluid or gel comprising a dielectric insulation fluid mixture or gas mixture comprising an organofluorine compound.

15. The sensor of claim 14 wherein the organofluorine compound being selected from the group consisting of: a fluoroether, an oxirane, a fluoroamine, a fluoroketone, a fluoroolefin, and mixtures and/or decomposition products thereof.

16. The sensor of claim 15, wherein the insulating fluid or gel comprising background gas or carrier gas different from the organofluorine compound and being selected from the group consisting of: air, $N_2$, $O_2$, $CO_2$, a noble gas, $H_2$; $NO_2$, NO, $N_2O$; fluorocarbons and perfluorocarbons and mixtures thereof.

17. An optical fiber current or magnetic or voltage or electric field sensor comprising a signal processing unit including inputs for each of the signals as measured by two or more detectors and filters and at least a light source and at least two or three optical transmission channels, with one channel providing a forward channel for the light to a sensing element and one or two channel(s) providing return detector channel(s) for the light to the detector(s), one or more passive optical elements for introducing a static bias optical phase shift between two different sets of light waves having different velocities within said sensing element in the presence of a non-vanishing measurand field, and for converting a total optical phase shift including said static bias optical phase shift and an optical phase shift induced by the measurand field into changes of optical power, the optical power being in the case of two detector channels of opposite signs (anti-phase), and a polarisation maintaining (PM) fiber being connected directly or indirectly via at least one retarder or Faraday rotator element to said sensing element, wherein at least parts of said one or more passive optical elements are in thermal contact with a temperature stabilizing unit providing a controlled temperature environment for said one or more passive optical elements wherein the temperature stabilizing unit comprises at least one self-regulated heating resistor, wherein the one or more passive optical elements are at ground potential and wherein the PM fiber provides an optical connection from ground potential to the potential of the sensing element being different from the ground potential, and wherein the sensor is a sensor for measuring DC current.

* * * * *